United States Patent
Medlin, Sr. et al.

(10) Patent No.: US 8,215,597 B1
(45) Date of Patent: Jul. 10, 2012

(54) ELECTRICAL BOX SUPPORT TAB CONSTRUCTION

(76) Inventors: Lewis B. Medlin, Sr., Blue Ridge, VA (US); Lewis B. Medlin, Jr., Vinton, VA (US)

( * ) Notice: Subject to any disclaimer, the term of this patent is extended or adjusted under 35 U.S.C. 154(b) by 841 days.

(21) Appl. No.: 12/218,327

(22) Filed: Jul. 14, 2008

(51) Int. Cl.
*A47B 96/06* (2006.01)

(52) U.S. Cl. .............. 248/205.1; 248/200.1; 248/216.1; 248/906; 248/909

(58) Field of Classification Search .............. 248/216.1, 248/300, 316.8, 909, 906, 205.1, 200.1
See application file for complete search history.

(56) References Cited

U.S. PATENT DOCUMENTS

| | | | |
|---|---|---|---|
| 2,731,193 A * | 1/1956 | Lall et al. ................ | 417/423.15 |
| 4,533,060 A | 8/1985 | Medlin, Sr. | |
| 4,572,391 A | 2/1986 | Medlin, Sr. | |
| 4,603,789 A | 8/1986 | Medlin, Sr. | |
| 4,688,693 A | 8/1987 | Medlin, Jr. | |
| 4,732,356 A | 3/1988 | Medlin, Jr. | |
| 4,753,361 A | 6/1988 | Medlin, Jr. | |
| 4,757,908 A | 7/1988 | Medlin, Sr. | |
| 4,863,399 A | 9/1989 | Medlin, Jr. | |
| 4,957,251 A * | 9/1990 | Hubbard ...................... | 248/68.1 |
| 4,967,990 A * | 11/1990 | Rinderer .................... | 248/205.1 |
| 5,133,847 A * | 7/1992 | Boyd ........................... | 204/198 |
| 5,176,345 A | 1/1993 | Medlin | |
| 5,263,676 A | 11/1993 | Medlin, Jr. | |
| 5,405,111 A | 4/1995 | Medlin, Jr. | |
| 6,484,979 B1 | 11/2002 | Medlin, Jr. | |
| 6,484,980 B2 | 11/2002 | Medlin, Sr. | |
| 6,877,349 B2 | 4/2005 | Durney et al. | |
| 7,032,426 B2 | 4/2006 | Durney et al. | |
| 7,053,300 B2 * | 5/2006 | Denier et al. .................. | 174/58 |
| 7,152,449 B2 | 12/2006 | Durney et al. | |
| 7,152,450 B2 | 12/2006 | Durney et al. | |
| 7,222,511 B2 | 5/2007 | Durney et al. | |
| 7,263,869 B2 | 9/2007 | Durney et al. | |
| 7,296,455 B2 | 11/2007 | Durney et al. | |
| 7,350,390 B2 | 4/2008 | Durney et al. | |
| 7,354,639 B2 | 4/2008 | Durney et al. | |
| 7,823,846 B2 * | 11/2010 | Williams, III ............. | 248/200.1 |

* cited by examiner

*Primary Examiner* — Anita M King
(74) *Attorney, Agent, or Firm* — Olive & Olive, P.A.

(57) ABSTRACT

An improved construction and method of constructing a field-bendable stud-engaging tab for electrical box supports that can be formed with less tool wear and bent in the field (for example, to conform to particular electrical box depths) with less force than previously required, and when necessary, straightened and re-bent. Scores are formed in the tab during the manufacturing process by applying shear force with a punch to the sheet metal of the tab, typically by a method in which the punch is applied to a portion of the sheet metal that rests over a cavity in the die, creating a sheared edge in each score wherein the metal is at least partially fractured, said fracture coinciding with at least part of a corresponding bend line. The bend lines also comprise unscored areas. In the field, the tab can be bent and re-bent along the bend lines.

4 Claims, 4 Drawing Sheets

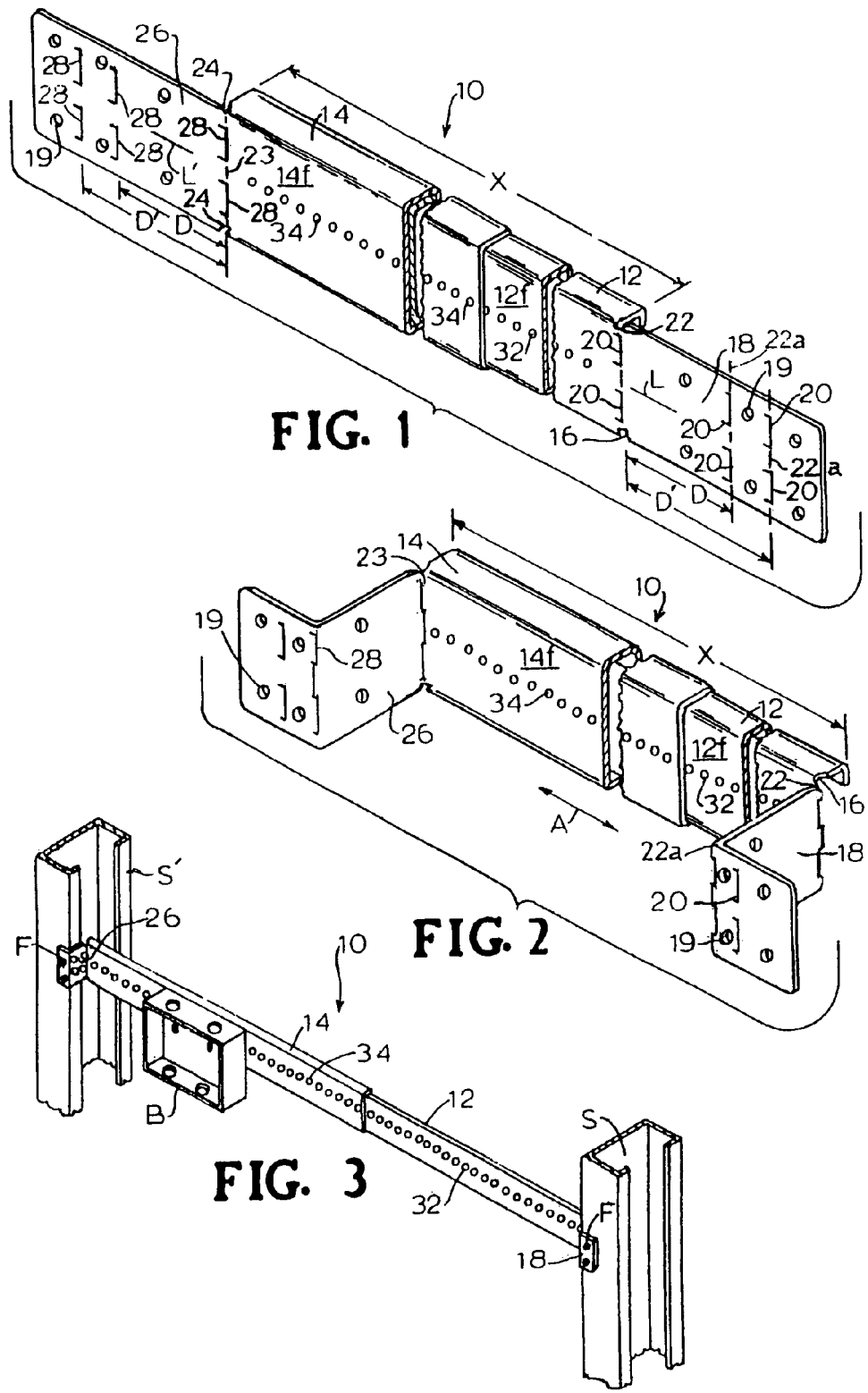

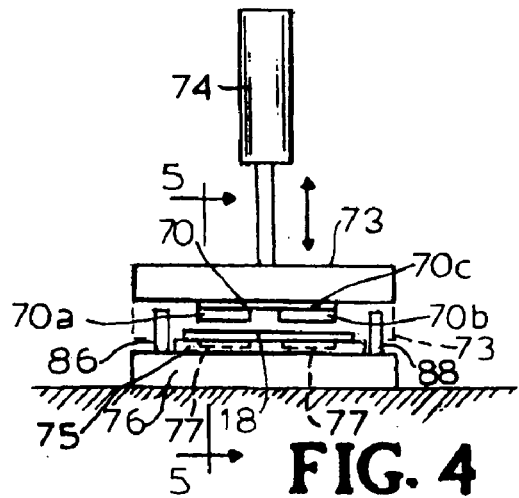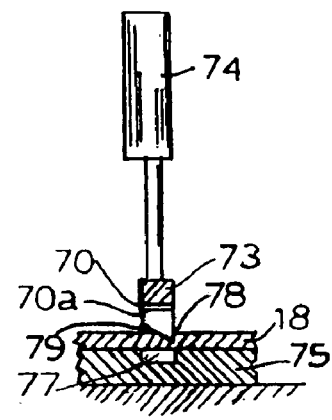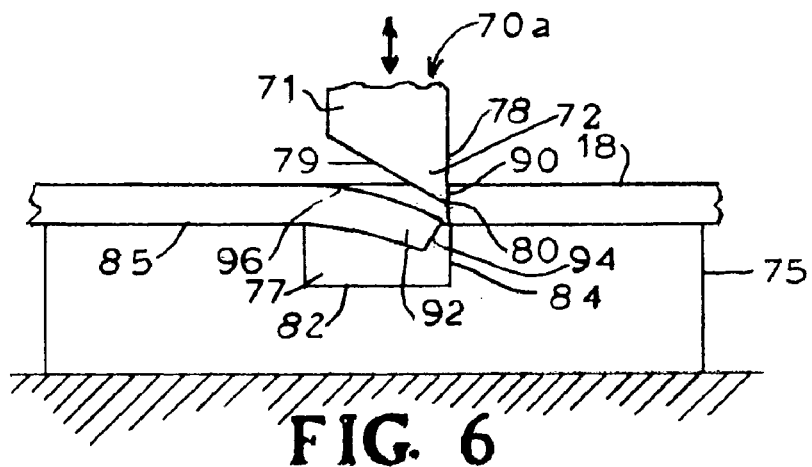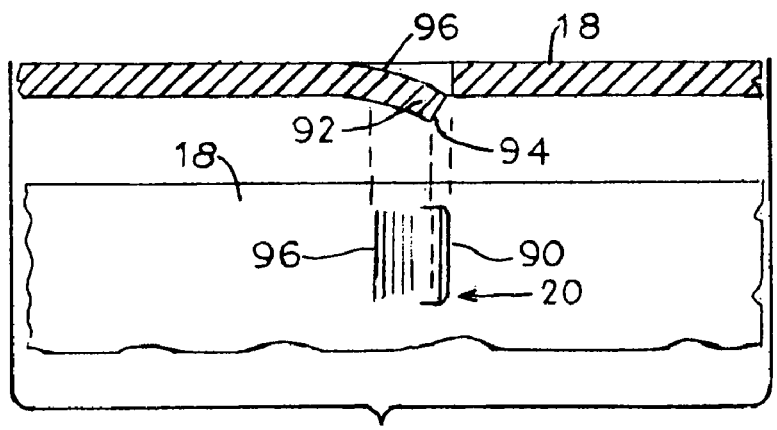

ELECTRICAL BOX SUPPORT TAB CONSTRUCTION

FIELD OF INVENTION

This invention relates in general to an improved construction and method of constructing an electrical box support with a field-bendable stud-engaging tab that can be formed with less tool wear and bent in the field (for example, to conform to a particular electrical box depth) with less force than previously required, and when necessary, straightened and re-bent.

BACKGROUND OF THE INVENTION

U.S. Pat. Nos. 6,484,979 and 6,484,980 contain useful summaries of the prior art in the field of electrical box supports and the teachings of those patents as well as those referenced therein are incorporated by reference. From the prior art, it can be seen that numerous attempts have been made to find a more satisfactory bend line construction that provides a precise bend line and permits straightening and re-bending the tabs used in such products without risking breakage of the tab metal, but that heretofore no entirely satisfactory such product or associated method of manufacturing it has been achieved.

U.S. Pat. Nos. 6,484,979 and 6,484,980 represent an earlier attempt to solve some of the problems addressed by the present invention. They describe in a first embodiment two and in a second embodiment three struts that are assembled in telescoping relation to accommodate different stud spacing. A tab is provided on each of the outer ends of the support. Each line along which the tab can be bent, referred to as a bend line, is defined by a discontinuous score line in the shape of spaced-apart indentations formed in each bend line. These indentations, which only partially penetrate the thickness of the metal, are sufficiently deep to weaken the metal along the bend line to facilitate bending, straightening, and re-bending. These indentations are formed by plastic deformation of the steel as a result of application of a compressive force sufficient to deform the metal. This compressive force is applied by a male die containing V-shaped protrusions that is pressed down upon the sheet metal of the tab, which in turns rests upon a flat base. The pressure of the V-shaped protrusions upon the metal of the tab causes some of the metal to be displaced, thereby creating narrow depressions, or slotted indentations, in each location where a V-shaped protrusion contacted the metal of the tab. It has been discovered over time that although the method of forming indentations in the tab with a V-shaped protrusion, and the resulting tab, had many advantages over the then-existing prior art, nonetheless, the dies being referred to have a limited life span requiring substantial oversight and it would be desirable to further improve the life of the tool while maintaining and if possible improving upon the bend life of the tab in the field. Furthermore, it has been discovered that optimally according to prior practice, a compressive force of around five tons should be applied to appropriately form each indentation in the tab, thereby creating bend lines. By contrast, the present inventor has discovered that it would be desirable to form bend lines in such tabs using less force in order to simplify tooling requirements and extend the life of the tools.

From the foregoing description and the prior art references, it can be seen that numerous attempts have been made to find a more satisfactory bend line construction that permits bending, straightening, and re-bending without risking breakage of the tab metal prior to its final installation. Therefore, one object of the invention is to provide a further improved tab construction that, when used in connection with electrical box supports, can be applied to either a telescoping or non-telescoping type support, wherein the tab can be field bent along a well-defined bend line to accommodate boxes of different depths and when necessary, can be straightened and re-bent along the same or a different well-defined bend line without risk of breaking the metal forming the tab, and to accomplish this while maintaining a reasonably trouble-free work environment for the manufacture of the tab without continual oversight, maintenance, and tool replacement. An additional object is to design the tab and the method of making it so that less force need be applied to the die in order to create a bend line, and so that when the tab is made, a much longer tool life is achieved. A further object is to form a tab in such a way as to create indentations in the tab whose boundaries are at least partially sheared to facilitate ease of field bending. Other objects will become apparent as the description proceeds.

Prior to further describing the invention, some terms will be defined. The terms "box" and "electrical box" as used herein are intended to refer to a junction box, receptacle box, switch box, terminal box, connector box or the like as are known in the electrical trade. The term "stud" as used herein is intended to include any location to which an electrical box support can be mounted, which typically would be structural members in a building surface, including wall studs, joists, rafters, etc. The term "wall" as used herein is intended to include ceiling and floor surfaces as well as walls.

The word "score" when used with reference to the invention is used to refer to a depression, one or more of which are formed in each substantially flat metal tab by a punch and die during manufacture of a tab. The referred-to depression has a boundary, one section of which includes a substantially straight weakened and/or sheared edge (referred to hereafter as a "sheared edge") and another section of which includes a substantially parallel edge (referred to hereafter as the "opposing shoulder") opposite the sheared edge. As will hereafter be explained, the opposing shoulder may be less sharply defined than is the sheared edge, typically being bent, with a slightly rounded or sloping edge rather than a sharp edge. The term "score line" refers to a straight line along which the metal has been weakened and/or sheared. The above-referenced sheared edge of a score is an example of a score line. A "discontinuous score line" is a line composed of two or more aligned score lines separated by a section of metal that has not been weakened or sheared. One score includes one score line. Two scores in alignment with a non-weakened portion in between make up a "discontinuous score line."

The term "bend line" refers both to a substantially straight line along which the tab has already been bent, and to such a line along which the tab could be bent if desired. The bend line coincides with at least one score line, which weakens the tab, thereby causing any bending forces applied to the tab to produce a bend in the weakened region along the score line. The bend line also includes at least one region that has no scores and that preferably has not otherwise been weakened, thereby giving such regions a degree of strength. A discontinuous score line is a form of bend line.

The term "compressive force" refers to a force applied to at least one side of a tab so as to cause or tend to cause the two opposing sides of the tab to move closer to each other. The term "shear force" refers to a force applied so as to cause or tend to cause two adjacent parts of the same tab to slide relative to each other, in a direction generally parallel to their plane of contact or, stated differently, to slide in the direction parallel to the direction of travel of the applied force (since here, the force is applied to the tab from a uniform generally vertical direction). The term "plastic deformation" refers to deformation that is substantially permanent or nonrecoverable after release of the applied force. Other terms will be defined later as they arise in the description.

SUMMARY OF THE INVENTION

The improved electrical box support tab construction and method of the present invention is useful for both the telescoping as well as the non-telescoping type electrical box support formed of sheet metal and adapted to support an electrical box. The electrical box support has a tab on at least one end. Typically, such an electrical box support is intended to extend between a pair of wall studs and hence has a tab on each end. Each tab can be attached to a stud (or other structure) after being bent according to the specifications of the particular structure. The construction of these tabs, and the method by which they are constructed, distinguishes the present invention.

Each tab is made from a piece of substantially planar metal sheet joined to and typically integral with the electrical box support. The tab typically has at least one transverse bend line. Preferably, the tab has additional bend lines parallel to the first such bend line. The tab can be field bent along any one or more of these bend lines. The bend lines lie along at least one and, for a typically sized tab, preferably two score lines. Where more than one score is present on a score line, the scores are discontinuous, i.e. they are spaced apart. Where a score is present on a bend line that coincides with one or more notches in the tab, the score is spaced apart from each such notch. The position of the bend lines on the tab preferably coincides with positions at which a person installing an electrical box typically would be expected to bend the electrical box support in order to fit it around various boxes and studs having common dimensions and spacing.

Each score has a boundary defining its area. Each score penetrates the surface of the planar metal sheet along a major portion of the score's boundary. Along one portion of the score's boundary is a sheared edge. The sheared edge is substantially created by a shear force, wherein the shear force has caused that sheared edge to at least partially fracture, said fracture coinciding with at least part of the corresponding bend line or score line. That fracture weakens the tab, so that a bending force applied to a bend line that incorporates the score containing the sheared edge will cause the tab to bend along the sheared edge. This is how the location of the field bend is controlled in advance during manufacture of the tab. The score also has an opposing shoulder. The opposing shoulder has no fracture, and may not even penetrate the surface of the metal sheet. The score can also be looked at as a region of the planar metal sheet that has been at least partially weakened by the shear force applied to the sheared edge, thereby facilitating the tab being field bent along the weakened edge, which coincides with the bend line, and when necessary after being bent to be straightened and re-bent without further substantially fracturing the metal comprising the tab. It should be noted that part of the bend line is not along a score and hence remains unfractured by the manufacturing process, thereby maintaining the strength of the tab along the unfractured portion of the bend line.

As will be more particularly set out below, when the sheared edge is created, at least a portion of the metal that is deformed to create the sheared edge may be, but need not be, so fractured that it no longer is joined to that portion of the metal in the score that is connected to the opposing shoulder. If it is so fractured, the metal of the sheared edge may nonetheless touch or alternatively may be entirely disconnected from and not touch, the metal connected to the opposing shoulder. Compressive force applied by the punch in addition to the shear force may assist the separation of the sheared edge from the metal connected to the opposing shoulder. The same condition need not apply along the entire length of the sheared edge. That is, the metal of the sheared edge and the metal connected to the opposing shoulder may touch or be joined at some locations and not at others.

Another expression of the invention is to be found in a method for forming an electrical box support, of the type previously described, from a planar metal sheet. The support has a tab made of sheet metal on at least one end, and typically on two ends, each tab being designed to be attached to a stud. The electrical box support is made according to the prior art, for example as taught in U.S. Pat. No. 6,484,980, except with respect to the tabs which are constructed according to the invention as described herein. During manufacture, each tab is made with at least one transverse bend line intended to enable precise bending in the field. The tab can have more than one transverse bend line, and if there is more than one, the bend lines are parallel. Each bend line is characterized by the presence of one or more scores (as previously defined and described) along a discontinuous score line.

Shear force is applied to a tab in order to form each score, using a punch. The precision-formed point of each punch is straight at the back and diagonal on its front. The intersection of the front and back of the point preferably is chamfered. The chamfer can be so narrow in diameter as to be virtually non-existent, forming little more than a point at which the two flat surfaces meet, or it can be somewhat broader. Preferably it is a narrow edge but slightly wider than a point, to give it added strength when applied under force to the planar metal sheet as hereafter described.

In one aspect of the method of the invention, the shearing is carried out using a die beneath the punch with the planar metal sheet placed between the punch and the die, and with the punch capable of moving toward the die during the downward stroke of the punch far enough to enter the planar metal sheet but not far enough to emerge from the other side of the planar metal sheet.

In another aspect of the method of the invention, the die beneath the punch has a generally flat upper surface with a cavity in the upper surface beneath the punch, the cavity having at least one substantially straight edge. The substantially straight edge of the cavity is positioned parallel to and slightly apart from the straight back side of the point of the punch, so as to permit the planar metal sheet displaced downward by the downward stroke of the punch to enter the cavity of the die during the downward stroke of the punch. The straight edge of the cavity is placed close to the straight edge of the descending punch, but far enough away so that were the punch to descend beyond its normal range, it would pass closely by the straight edge of the cavity and down into the cavity without touching the die. Although a portion of the metal sheet is above the cavity as described, an adjoining portion of the metal sheet is supported by the die face adjacent the straight edge of the cavity, close to the entry point of the punch into the sheet, so that the descending punch creates a shear force on the metal sheet as one portion of the metal sheet continues to rest on the surface of the die while an adjacent portion of the metal sheet that formerly rested above the cavity is forced to slide downward, in a direction parallel to the force applied to the tab by the punch.

Other embodiments and aspects of the invention will be appreciated by persons skilled in the art from the drawings and further description and claims herein.

BRIEF DESCRIPTION OF THE DRAWINGS

FIG. 1 is a perspective illustration of a first embodiment of an electrical box support embodying the inventive tabs, made up of two releasably engaged struts and showing the front surfaces of the inventive tabs at the ends thereof, before the tabs have been bent in the field for attachment to adjacent wall studs and to accommodate to a particular depth of electrical box.

FIG. 2 is a perspective illustration of the adjustable electrical box support embodying the inventive tabs as shown in FIG. 1 after the tabs have been bent to accommodate a particular depth of box and in a form suitable to being attached to a pair of spaced apart wall studs.

FIG. 3 is a perspective illustration of the adjustable electrical box support embodying the inventive tabs as shown in FIG. 1 after being attached to a pair of adjacent wall studs with an electrical box of a particular depth mounted thereto.

FIG. 4 shows a side view of the punch and die assembly used to form the inventive tabs, with a tab placed therein.

FIG. 5 is a section view of a portion of the punch and die assembly with a tab placed therein, taken in the direction of line 5-5 of FIG. 4.

FIG. 6 is an enlarged fragmentary view of a side elevation of a portion of the punch and die assembly with a tab placed therein, taken immediately after the punch has made its full descent and is partially raised.

FIG. 7 is an enlarged fragmentary side view of the tab shown in FIG. 6, above a plan view of a section of that tab, with dashed lines from the side view to the plan view showing the relative position of certain elements of the score in both views.

DETAILED DESCRIPTION OF THE INVENTION

Figure 8:
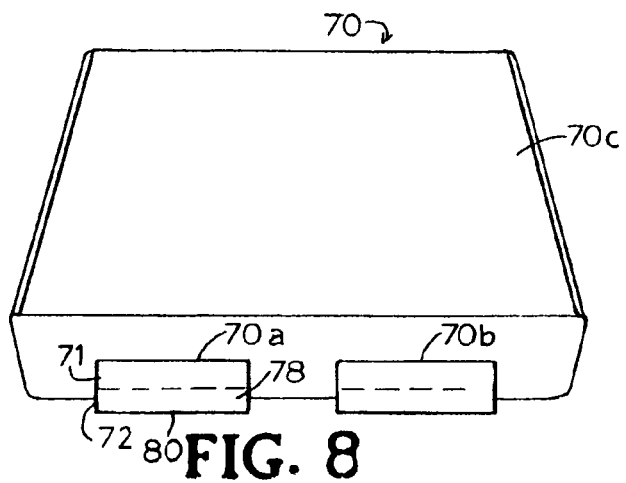
FIG. 8 is a perspective view of the back of the punch used to form the inventive tabs.

The inventive tabs are described with reference to their use on electrical box supports. In reference to FIG. 1, adjustable electrical box support 10 is illustrated as comprising inner strut 12 and outer strut 14. Inner strut 12 and outer strut 14 are formed as elongate channels that are sized to telescopically nest. Inner strut 12 slidingly resides within outer strut 14 to allow a user to telescopically adjust the overall support length X shown in FIG. 1. Inner strut 12 and outer strut 14 of support 10 are preferably formed with a channel-shaped cross section to provide stiffness and maintain secure engagement of the mating struts. Inner strut 12 and outer strut 14 are preferably formed of galvanized sheet steel, as is known in the electrical trade, of appropriate gauge and of channel dimensions to provide sufficiently stiff support for securely mounting one or more electrical boxes or other devices thereon. For example, 24-gauge (0.6 mm; 0.025 inch thick) sheet steel has been found to be a satisfactory material for the struts including the inventive tabs hereafter described.

Inner strut 12 terminates with tab 18 that essentially is an extension of web 12f. A pair of notches or cuts 16 are formed on opposite edges of tab 18 at its juncture to the inner strut web 12f. These notches or cuts 16 can be conventional minimal notches or cuts to provide stress relief during the cutting and bending operation. They may also guide bending of the tab, as shown in FIG. 1. A bend line 22 preferably comprising one score 20 and two notches 16, here shown as comprising two scores 20 and two notches 16 (one of which is not seen in this view), is formed in the surface of tab 18 substantially perpendicular to axis L of inner strut 12 and axis L' of outer strut 14. As can be seen, notch 16 is formed with straight edges, two of which terminate at a point substantially coincident with a terminus of bend line 22, to guide the bending of tab 18 along bend line 22. A bend line 22a comprising a pair of scores 20, 20 is formed in the surface of tab 18 substantially perpendicular to axis L of inner strut 12 and axis L' of outer strut 14, and at selected distances D, D' from notches 16, leaving some additional length of tab 18 extending beyond. Tab 18 can be bent along these bend lines, preferably to form a right angle at the bend line.

Distance D is preferably determined to allow a standard 1½-inch (38-mm) deep electrical box, when mounted to support 10 and extending outwardly therefrom, to be flush with the inner surface of a wall subsequently assembled to the wall studs S and S' (FIG. 3). Distance D' is located similarly for a standard electrical box that is 2⅛ inches (54 mm) deep. In other words, distance D or distance D' is substantially equal to the depth of the electrical box being mounted.

Outer strut 14 has tab 26 that essentially is an extension of web 14f, with notches 24, similar to the previously described notches 16, and scores 28, 28, to facilitate bending of tab 26 at a right angle as described above in relation to tab 18 of inner strut 12. Bend line 23 illustrates two notches 24, formed as described with respect to notches 16, to guide the bending of tab 26 along bend line 23. It has been discovered that such notches are particularly useful for guiding bending when only one score is present on a bend line.

In the interest of improving the efficiency of field installation, end tabs 18, 26 may be preformed (not shown) at a right angle to the length of electrical box support 10 at the factory and shipped in this form. When this is done, the installer only has to make a single bend at each end, so that the end of the tab can bend around and be affixed to an adjacent stud, thus cutting the required number of bends for this field-bending operation in half.

FIG. 2 shows support 10 after tab 18 and tab 26 have each been bent to form a pair of sequential right angles for installation between a pair of adjacent studs. According to the present invention, tab 18, by way of example, is bent at bend line 22 in a first bend direction and at bend line 22a in a second bend direction. After bending tabs 18 and 26, the assembled inner strut 12 and outer strut 14 are telescoped to adjust length X of support 10 in the direction shown by arrow A to fit the stud separation distance required.

Referring now to FIG. 3, electrical box support 10 is shown after it has been adjusted in length and fixedly attached by means of fasteners F to adjacent studs S and S', with detents 32 and 34 releasably locking the support length X during attachment. As noted above, length X of support 10, when assembled, is substantially equal to the spacing between adjacent studs S, S'. Tabs 18 and 26 may be pre-punched with holes 19 to accept fasteners F (as illustrated in FIGS. 1, 2, and 3) or the needed holes may be formed during installation.

To supplement what has been previously stated with regard to the scores 20 (FIG. 1), it has been found through further experimentation that when the struts 12 and 14 are made of 24 gauge sheet steel (0.6 mm; 0.025 inch thick) and the tabs, i.e. tab 18 and 26, are 1¾ inches in width and scores 20, 28 are each 7/16 inch long with a totally fractured sheared edge, tabs 18, 26 can be repeatedly straightened and re-bent, typically up to at least eight times without tab metal breakage. This is of course an extremely important advantage in the field where it is often necessary for reasons previously described to straighten and re-bend a tab after having been bent on a different bend line. Such bending, straightening, and re-bending may in fact have to be repeated several times because of particular field conditions, but many of the prior art methods produce a tab with bend lines defined by spaced apart holes or slots in which the metal rapidly fractures when repeatedly bent along the bend lines and hence breaks in the field during the bending process prior to installation. Another advantage to be found when scores 20, 28 are formed in the manner described, is that when bent and even after being straightened and re-bent, the tab bend lines of the invention permit the tab to have a so-called square bend, i.e. a relatively sharp 90-degree angle.

In FIG. 4 and FIG. 5, side and end views, respectively, are shown of a punch and die assembly for forming scores 20 (FIG. 1), in the tab 18. Each punch 70 is composed of at least one punch head, and preferably two such punch heads 70a, 70b mounted on a punch base 70c. In FIG. 4, punch 70 is shown with its base 70c mounted, at the side opposite that on which the punch heads 70a, 70b are attached, to the bottom surface of press support 73 and actuated by a press drive 74. Other means of driving a punch are understood in the art and could be applied to the invention.

Figure 10:
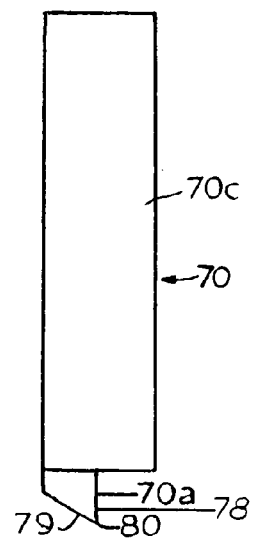
FIG. 10 is a side view of the punch used to form the inventive tabs.
Figure 11:
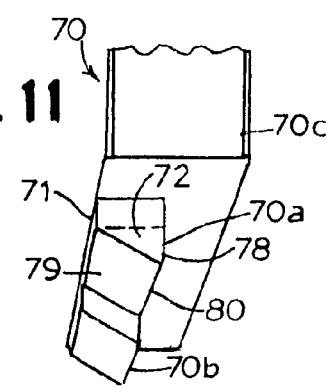
FIG. 11 is a close-up perspective side view of a portion of the punch used to form the inventive tabs.

The details of the punch portion of the assembly are best shown in FIGS. 8, 9, 10 and 11. Perspective views of the back and front of the punch 70 are provided respectively in FIGS. 8 and 9. A side view of punch 70 is provided in FIG. 10, and FIG. 11 provides a perspective side view of a portion of punch 70, focusing on the punch heads 70a, 70b.

Figure 9:
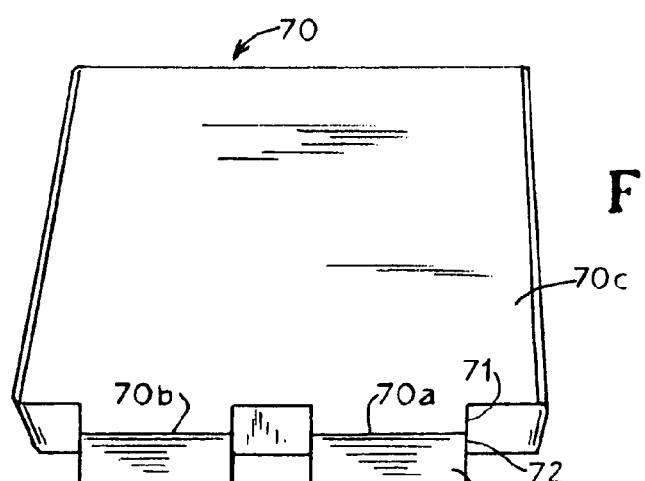
FIG. 9 is a perspective view of the front of the punch used to form the inventive tabs.

Each punch head 70a, 70b is provided with a punch head shaft 71 joined to a punch head point 72. In FIG. 9 and FIG. 11, punch head shaft 71 and punch head point 72 are shown with respect to punch head 70a, and the location of the juncture between the punch head shaft 71 and the punch head point 72 is indicated by a dashed line. The punch head shaft 71 is in the shape of a rectangular box, a back face of which can be seen in FIG. 8, a front face of which can be seen in FIG. 9, a side face of which can be seen in FIG. 10, and a side face and a portion of the back face of which can be seen in FIG. 11. The punch head point 72 is in the general shape of a right triangular prism, the front face of which can be seen in FIG. 9, a side face of which can be seen in FIG. 10, and a side face and the front face of which can be seen in FIG. 11. The bottom face of the punch head point 72 is flat, is rectangular in shape, and is equal in size to the punch head shaft 71 to which it is joined, although persons skilled in the art will appreciate that variations in the shape and size of the punch head shaft 71 and/or punch head point 72 can be made in keeping with the teachings of the invention, in which case the bottom face of the punch head point 72 may not be equal in size or shape to the punch head shaft 71 to which it is joined. The back 78 and front 79 faces of the punch head point are each flat, rectangular in shape, and equal in width to the width of the punch head shaft as shown respectively in FIG. 8 and FIG. 9. The two side faces of the punch head point 72 preferably are flat, and are triangular in shape, as shown with respect to one such side face in FIG. 11. Preferably the punch head shaft 71 is relatively short in height, approximately equal to the height of the punch head point 72 (as shown in FIG. 11). Alternatively, the shaft could be longer or shorter, or a shaft of reduced diameter in at least one dimension as compared to the point could be used. The intersection of the back face 78 and front face 79 of the punch head point preferably is chamfered to form a narrow, straight bottom edge hereafter referred to as the chamfer 80, to reduce cutting-edge chipping at the point. Preferably, at least each punch head is a single integral structure, and the entire punch 70 including the punch heads 70a, 70b and punch base 70c may be an integral structure as shown in FIG. 9.

As shown in FIG. 4, Punch 70 is positioned above a flat die 75. The die 75 preferably rests on a die holder 76. The die 75 has a cavity 77 (FIG. 5, and also shown with dashed lines in FIG. 4 and, in an enlarged view, in FIG. 15) directly beneath each of the punch heads 70a, 70b. The shape of cavity 77 is roughly the same as the shape of punch shaft 71 but can be any shape appropriate to serve the function described herein, and the cavity 77 is large enough to permit entry of punch point 72 and of displaced material 92 (FIG. 6) from tab 18, as hereafter described. These cavities 77 each penetrate the die face 85 (FIG. 6) of die 75 and extend at least partially through the body of die 75. Each cavity 77 presents a straight edge 84 (FIG. 6) parallel to, and slightly offset from, the back face 78 of the corresponding punch head. The offset is such that if the punch head point 72 were to descend lower than the die face 85 of the die 75, the punch would enter the cavity without touching the die. The punch 70 and die 75 are formed of hardened steel. The depth of the press stroke is limited by precision stops 86, 88, which precisely limit the travel of punch 70 so as to permit the punch heads to enter the metal sheet of tab 18 but not to emerge from the other side. The depth to which the punch heads 70a, 70b can travel is indicated in FIG. 4 by dashed line 73 and their travel is shown as limited such that it ends at a point higher than the bottom of cavities 77.

Referring now to FIG. 6, part of the process for making a score in a tab is shown. FIG. 6 shows an enlarged fragmentary view of a side elevation of the punch and die assembly with a tab 18 placed therein, taken immediately after the punch 70 (the punch head shaft 71 and punch head point 72 of which are shown in FIG. 6) has made its full descent and is partially raised. The punch 70 is shown in FIG. 6 as having descended into the surface of the metal sheet of tab 18 but not descended far enough to emerge from the bottom of the tab. The front face 78 of the punch head point 72 is shown aligned just to one side of the edge 84 of the die cavity 77. The figure shows a cross section of a portion of the punch 70, the die 75, and a tab 18 placed on the die. The back face 78 as well as the front face 79 of the punch head point 72 can be seen, as well as the chamfer 80 between those front and back faces. The die 75 is shown in vertical cross section through die cavity 77. Edge 84 of the die cavity 77, together with the adjoining portion of die face 85, can be seen supporting the tab 18 beside the entry-point of the punch head point 72 into the tab 18. Also visible in FIG. 6 is the displaced material 92 from the tab 18 extending down into the die cavity 77. The sheared edge 94 of that displaced material 92 is shown separated from the sheared edge 90 of the tab 18, although in some constructions of the invention the sheared edge 94 of displaced material 92 is not fully separated from the sheared edge 90 of the tab 18. Sheared edge 90 forms the sheared edge of a score 20 (see FIG. 7) that has been produced by the action of the punch 70 against the metal sheet of the tab 18. As can be seen in FIG. 6, opposing shoulder 96, which forms a boundary of the score opposite to that formed by sheared edge 90, is not depicted as a sharp edge and typically will not be a sharp edge. The sheared edges 90, 94 are substantially produced by shear force as a result of the punch head 70*a*, and particularly the back face 78 of the punch head point 72, being forced against the metal of tab 18 as it enters cavity 77 parallel to edge 84, thus causing the metal of sheared edge 94 to slide relative to the metal of sheared edge 90, in a direction generally parallel to the direction of travel of back face 78.

FIG. 7 illustrates the relationship of the enlarged fragmentary view of FIG. 6 to a plan view of a score 20 in a tab 18. FIG. 7 repeats the sectional view of tab 18 from FIG. 6, but without showing the punch and die that formed a score therein. FIG. 7 also shows a plan view of tab 18 as viewed from above the tab, showing the location of score 20 thereon. Elements forming score 20 are connected by dashed lines from their illustration in the sectional view at the top of FIG. 7 to their illustration in the plan view at the bottom of FIG. 7, to show their orientation and relative positions. In particular, sheared edge 90 is shown in cross-section and then in plan view, with a dashed line connecting the two illustrations of that element. Opposing shoulder 96 is shown in cross-section and in plan view, again with a dashed line connecting the two elements. Sheared edge 94 is shown in cross-section and in plan view, with a dashed line showing the position of the lower edge of sheared edge 94 in cross section and in plan view. It should be noted that sheared edge 94 of the displaced material from the tab 18 is shown separated from the sheared edge 90 of the tab 18, although in other embodiments the two edges are not separated or are only partially separated.

Figure 12:
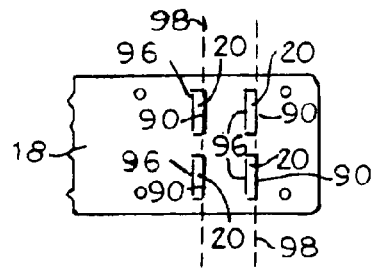
FIG. 12 is a top plan view of a tab with two bend lines and four scores.

In FIG. 12, a tab 18 is shown with two bend lines 98, each bend line with two scores 20. The sheared edge 90 of the score as well as the opposing shoulder 96 of the score are shown.

Figure 13:
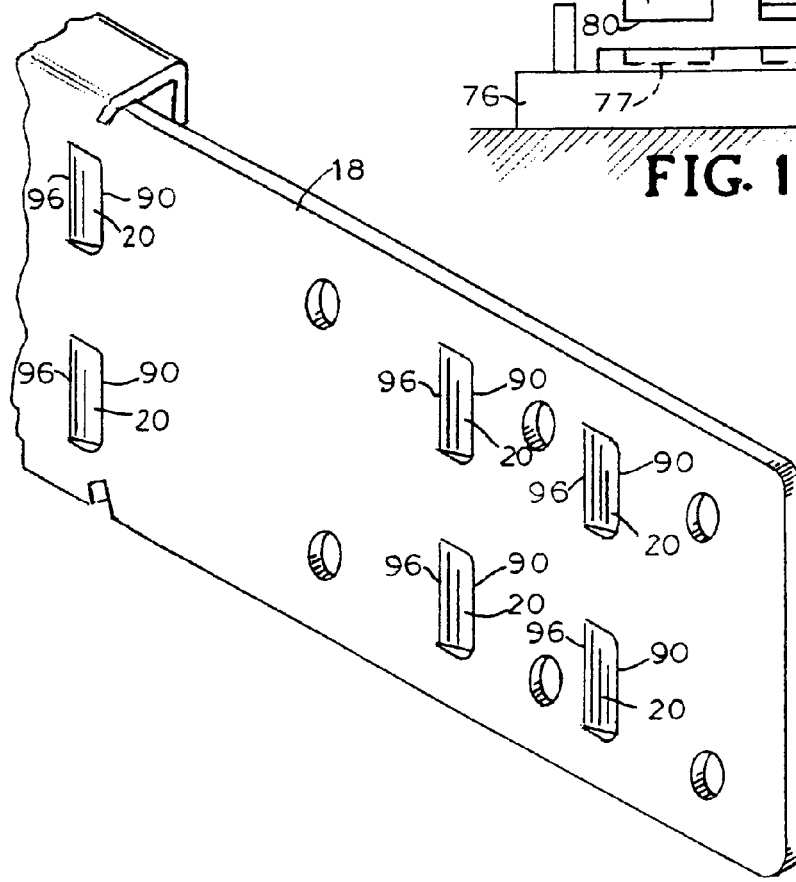
FIG. 13 shows an enlarged fragmentary portion of the right end of the electrical box support of FIG. 1, including tab 18, to illustrate the scores shown in greater detail.

More detail of the scores 20 of FIG. 12 is shown in FIG. 13. The sheared edge 90 and the opposing shoulder 96 are both shown. As explained above, the boundary of each score 20 includes the sheared edge 90 and the opposing shoulder 96.

Figure 14:
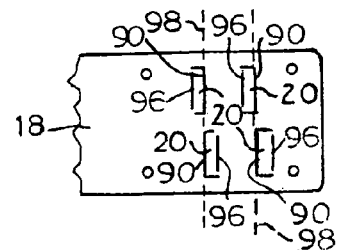
FIG. 14 shows a tab punched in an alternate configuration from that shown in FIG. 12.
Figure 15:
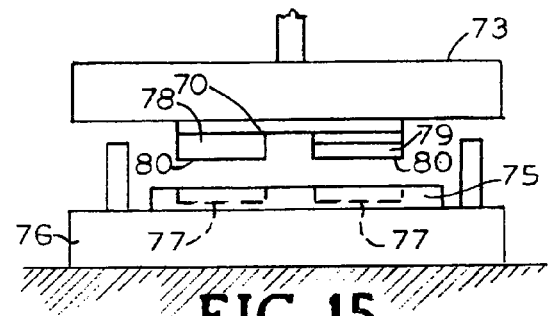
FIG. 15 shows an alternate configuration of the punch and die assembly, used to punch the tab shown in FIG. 14.

Various embodiments of the punch assembly used to carry out the method of the invention have one, two, or more punch heads. In some embodiments having more than one punch head, the orientation of each punch head is the same, as shown in FIG. 4. But alternatively, each punch head can be oriented in a direction opposite to that of one or more adjacent punch heads. FIG. 14 depicts the scores 20 produced when such an alternate punch configuration, depicted in FIG. 15, is used, and the position of those scores 20 with respect to the bend line 98. For each bend line 98, the opposing shoulders 96, 96 of the scores 20 that help define the bend line fall on opposite sides of that bend line. This is in contrast to the scores shown in FIG. 12, where for each bend line 98, the opposing shoulders 96, 96 fall on the same side of that bend line.

FIG. 15 illustrates the alternative punch embodiment used to produce the scores shown in FIG. 14, in which the punch heads of punch 70 are oriented so that the front face 79 of one punch head point and the back face 78 of an adjacent punch head point each face the front of the punch 70. When the punch assembly containing these two oppositely oriented punch heads is used, it creates a score pair that is symmetrical about the bend line.

In summary, the following are among the advantages of the sheared score bend line tab construction of the invention employed on electrical box supports used for field installation of electrical boxes:

1. Tabs can be bent, straightened and re-bent without the risk of premature breaking of the metal forming the tab.
2. The bend line made up of one or more scores provides a sufficiently precise point of bend to ensure that the outlet box (once installed) will rest in a plane parallel to the sheetrock.
3. There is a minimum radius at the point of the bend, allowing the tabs to nest snugly against the studs.
4. The centerline of the bend is substantially uniform with respect to the discontinuous score line.
5. The mounting tabs, i.e. that portion of the tabs remaining at the end after bending and used to mount the tab to the stub, will always be substantially the same length, as there is virtually no variation in the bend line.
6. Unlike scores made with perforations intended to facilitate field punching out of scores along selected bend lines, metal does not have to be removed to establish the point of bend.
7. Maximum strength and rigidity to the electrical box support's mounting tabs is achieved while retaining a substantial portion of the metal's resiliency to withstand multiple bend cycles without fractures.
8. The die used to form the score lines is not subject to chipping or damage even after repeated use.
9. The force required to operate the punch in the shearing fashion of the invention is much less than the five tons of force needed to operate the die of the prior art to form each indentation in the tab in a compressing fashion. Less than 1000 pounds of pressure is required to operate the punch of the invention to form each indentation, and the punch can be effectively operated with less than 300 pounds of force. This reduction in force leads to longer tool life and much simpler operation of the manufacturing equipment.

The above description of embodiments of the invention is provided by way of example and not as a limitation. Accordingly, various modifications and variations obvious to a person of ordinary skill in the art to which it pertains are deemed to lie within the scope and spirit of the invention as set forth in the following claims.

What is claimed is:

1. In an electrical box support formed of sheet metal and adapted to extend between a pair of wall studs and support an electrical box, said electrical box support having on each of opposite ends a tab adapted for being attached to a respective one of said studs, each said tab comprising:
  (a) a planar metal sheet integral with and extending outwardly of said support;
  (b) at least one transverse bend line recognized as a line along which said tab can be field bent; and
  (c) on at least one side of each said transverse bend line at least one indentation, each said indentation being referred to here as a "score" and wherein each said score:
    (i) penetrates the surface of said planar metal sheet along a major portion of said score's boundary;
    (ii) has one substantially straight sheared edge created by the application of force comprising a shear force, sufficient to have caused said substantially straight sheared edge to at least partially fracture along said substantially straight sheared edge coinciding with at least part of said bend line;
    (iii) has an unsheared edge located substantially parallel to and opposite said straight sheared edge; and
    (iv) comprises a region of the planar metal sheet that has been at least partially weakened by the shear force applied to said sheared edge, thereby facilitating said tab being field bent along said bend line, and when necessary after being bent to be straightened and re-bent without further fracturing of the metal comprising said tab; and
  (d) for a bed line defined by multiple scores, said opposite edge of every score that defines said bend line lies on the same side of said bend line.

2. In an electrical box support formed of sheet metal and adapted to extend between a pair of wall studs and support an electrical box, said electrical box support having on each of opposite ends a tab adapted for being attached to a respective one of said studs, each said tab comprising:
- (a) a planar metal sheet integral with and extending outwardly of said support;
- (b) at least one transverse bend line recognized as a line along which said tab can be field bent; and
- (c) on at least one side of each transverse bend line at least one indentation, each said indentation being referred to here as a "score" and wherein each said score:
  - (i) penetrates the surface of said planar metal sheet along a major portion of said score's boundary;
  - (ii) has one substantially straight sheared edge created by the application of force comprising a shear force, sufficient to have caused said substantially straight sheared edge to at least partially fracture along said substantially straight sheared edge coinciding with at least part of said bend line;
  - (iii) has an unsheared edge located substantially parallel to and opposite said straight sheared edge; and
  - (iv) comprises a region of the planar metal sheet that has been at least partially weakened by the shear force applied to said sheared edge, thereby facilitating said tab being field bent along said bend line, and when necessary after being bent to be straightened and re-bent without further fracturing of the metal comprising said tab; and
- (d) at least one of said transverse bend lines having at least two of said scores, each said score being spaced apart from each other score along said transverse bend line and wherein each of said scores is placed on the same side of the bend line.

3. In an electrical box support formed of sheet metal and adapted to extend between a pair of wall studs and support an electrical box, said electrical box support having on each of opposite ends a tab adapted for being attached to a respective one of said studs, each said tab comprising:
- (a) a planar metal sheet integral with and extending outwardly of said support;
- (b) at least one transverse bend line recognized as a line along which said tab can be field bent;
- (c) on at least one side of each said transverse bend line at least one indentation, each said indentation being referred to here as a "score" and wherein each said score:
  - (i) penetrates the surface of said planar metal sheet along a major portion of said score's boundary;
  - (ii) has one substantially straight sheared edge created by the application of force comprising a shear force, sufficient to have caused said substantially straight sheared edge to at least partially fracture along said substantially straight sheared edge coinciding with at least part of said bend line;
  - (iii) has an unsheared edge located substantially parallel to and opposite said straight sheared edge; and
  - (iv) comprises a region of the planar metal sheet that has been at least partially weakened by the shear force applied to said sheared edge, thereby facilitating said tab being field bent along said bend line, and when necessary after being bent to be straightened and re-bent without further fracturing of the metal comprising said tab; and
- (d) at least one of said transverse bend lines having at least two of said scores, each said score being spaced apart from each other score along said transverse bend line and wherein said unsheared opposite edge of every score that defines each said transverse bend line lies on the same side of said bend line.

4. The electrical box support of claim 3 wherein there is at least one notch on at least one side of said planar sheet of metal, said notch being located at a point where a transverse bend line terminates at the side of said planar sheet of metal, each said notch being shaped to guide bending of the tab along said transverse bend line.

* * * * *